US009772355B2

(12) United States Patent
Lin

(10) Patent No.: US 9,772,355 B2
(45) Date of Patent: Sep. 26, 2017

(54) BUSBAR CURRENT SENSOR

(71) Applicant: SCHNEIDER ELECTRIC IT CORPORATION, West Kingston, RI (US)

(72) Inventor: Hsinhsiao Lin, New Taipei (TW)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 55 days.

(21) Appl. No.: 14/898,224

(22) PCT Filed: Jun. 27, 2013

(86) PCT No.: PCT/US2013/048375
§ 371 (c)(1),
(2) Date: Dec. 14, 2015

(87) PCT Pub. No.: WO2014/209333
PCT Pub. Date: Dec. 31, 2014

(65) Prior Publication Data
US 2016/0131685 A1 May 12, 2016

(51) Int. Cl.
G01R 1/20 (2006.01)
G01R 19/25 (2006.01)
G01R 19/00 (2006.01)
H01R 25/00 (2006.01)

(52) U.S. Cl.
CPC ..... *G01R 19/2513* (2013.01); *G01R 19/0092* (2013.01); *H01R 25/003* (2013.01)

(58) Field of Classification Search
CPC ..... G01R 1/203; G01R 15/146; G01R 19/007
See application file for complete search history.

(56) References Cited

U.S. PATENT DOCUMENTS 5,796,389 A    8/1998  Bertram et al.
8,469,724 B1*  6/2013  Barnette ............ H01R 12/7088
                                                      439/86
2013/0119972 A1* 5/2013 Maguire .............. G01R 35/005
                                                      324/74

FOREIGN PATENT DOCUMENTS

EP    2541641 A1    1/2013

OTHER PUBLICATIONS

Notification of Transmittal of the International Search Report and the Written Opinion of the International Searching Authority from corresponding PCT/US2013/048375 dated Nov. 22, 2013.

* cited by examiner

Primary Examiner — Tung X Nguyen
(74) Attorney, Agent, or Firm — Lando & Anastasi, LLP

(57) ABSTRACT

According to one aspect, embodiments herein provide a Power Distribution Unit (PDU) comprising an input configured to be coupled to a power source and to receive input power, a busbar coupled to the input at a first location on the busbar, the bus bar having a resistance, at least one power outlet coupled to a second location on the busbar via a first output line and configured to provide output power to a load, and a sensing circuit coupled proximate to the first location on the busbar and coupled proximate to the second location on the busbar and configured to determine a voltage drop between the first location and the second location and to calculate a magnitude of an output current provided to the at least one power outlet via the output line based on the voltage drop and the resistance of the busbar.

16 Claims, 2 Drawing Sheets

BUSBAR CURRENT SENSOR

CROSS-REFERENCE TO RELATED APPLICATIONS

This application is a U.S. National Stage Application under 35 U.S.C. §371 of International Application No. PCT/US2013/048375, filed Jun. 27, 2013, titled BUSBAR CURRENT SENSOR, which is hereby incorporated herein by reference in its entirety.

BACKGROUND OF INVENTION

1. Field of Invention

At least some embodiments described herein relate generally to measuring output current of a power outlet.

2. Discussion of Related Art

Electrical appliances (e.g., office or home equipment, measuring instruments, medical devices, datacenter equipment such as routers and servers, etc.) may be configured to receive and operate on AC or DC power from an AC or DC source. Such electrical appliances commonly include a power supply cord that is configured to couple the electrical appliance to an AC or DC power outlet that provides AC or DC power to the appliance from the AC or DC source. The power outlet may be one of a plurality of power outlets of a power distribution unit (e.g., a power strip). Once a power supply cord and a power outlet are coupled together, AC or DC power from the power outlet is provided to the electrical appliance via the outlet and power supply cord.

SUMMARY OF INVENTION

At least one aspect of the invention is directed to a Power Distribution Unit (PDU) comprising an input configured to be coupled to a power source and to receive input power, a busbar coupled to the input at a first location on the busbar, the bus bar having a resistance, at least one power outlet coupled to a second location on the busbar via a first output line and configured to provide output power to a load, and a sensing circuit coupled proximate to the first location on the busbar and coupled proximate to the second location on the busbar and configured to determine a voltage drop between the first location and the second location and to calculate a magnitude of an output current provided to the at least one power outlet via the output line based on the voltage drop and the resistance of the busbar.

According to one embodiment, the sensing circuit includes at least one amplifier coupled proximate to the first location via a first sense line and proximate to the second location via a second sense line, and the at least one amplifier is configured to receive a first voltage signal and a second voltage signal and to measure a voltage drop between the first location and the second location based on a difference between the first voltage signal and the second voltage signal. In one embodiment, the at least one power outlet includes a first power outlet coupled to the second location on the busbar via the first output line and a second power outlet coupled to a third location on the busbar via a second output line, and the at least one amplifier includes a first amplifier coupled proximate to the first location via the first sense line and proximate to the second location on the busbar via the second sense line and a second amplifier coupled proximate to the first location via the first sense line and proximate to the third location on the busbar via a third sense line.

According to another embodiment, the first amplifier is configured to receive the first voltage signal and the second voltage signal, to measure the voltage drop between the first location and the second location based on the difference between the first voltage signal and the second voltage signal, and to generate a first amplified signal related to the voltage drop between the first location and the second location, and the second amplifier is configured to receive the first voltage signal and a third voltage signal, to measure the voltage drop between the first location and the third location based on a difference between the first voltage signal and the third voltage signal, and to generate a second amplified signal related to the voltage drop between the first location and the third location.

According to one embodiment, the sensing circuit further includes a controller coupled to the first amplifier and the second amplifier, and the controller is configured to receive the first amplified signal and the second amplified signal, to calculate a magnitude of a first output current provided to the first power outlet via the first output line based on the first amplified signal and the resistance of the busbar, and to calculate a magnitude of a second output current provided to the second power outlet via the second output line based on the second amplified signal, the first amplified signal, and the resistance of the busbar.

According to another embodiment, the PDU further comprises a multiplexer coupled to the controller, the first amplifier, and the second amplifier, and configured to receive the first amplified signal and the second amplified signal, and the controller is further configured to operate the multiplexer to select one of the first amplified signal and the second amplified signal and to provide the selected one of the first amplified signal and the second amplified signal to the controller. In one embodiment, the multiplexer includes an Analog to Digital (A/D) converter configured to provide a digital representation of the selected one of the first amplified signal and the second amplified signal to the controller.

Another aspect of the invention is directed to a method for monitoring a power distribution unit having an input, a busbar having a resistance, and a plurality of power outlets, each power outlet coupled to a location on the busbar, the method comprising receiving, at the input, input power from a power source, providing the input power to each one of the plurality of power outlets via the busbar, measuring a voltage drop between a first location on the busbar and each location on the busbar to which one of the plurality of power outlets is coupled, and calculating a magnitude of an output current provided to each one of the plurality of power outlets based on the measured voltage drop between the first location and the location to which each one of the plurality of power outlets is coupled and the resistance of the busbar.

According to one embodiment, measuring a voltage drop between the first location on the busbar and each location on the busbar to which one of the plurality of power outlets is coupled includes measuring a voltage drop between the first location on the busbar and a second location on the busbar to which a first one of the plurality of power outlets is coupled, and calculating a magnitude of an output current provided to each one of the plurality of power outlets includes calculating a magnitude of an output current provided to the first one of the plurality of power outlets based on the voltage drop between the first location and the second location and the resistance of the busbar.

According to another embodiment, measuring a voltage drop between the first location on the busbar and each location on the busbar to which one of the plurality of power outlets is coupled includes measuring a voltage drop between the first location on the busbar and a third location on the busbar to which a second one of the plurality of power outlets is coupled, and calculating a magnitude of an output current provided to each one of the plurality of power outlets includes calculating a magnitude of an output current provided to the second one of the plurality of power outlets based on the voltage drop between the first location and the third location, the magnitude of the output current provided to the first one of the plurality of power outlets, and the resistance of the busbar.

According to one embodiment, calculating a magnitude of an output current provided to the second one of the plurality of power outlets includes calculating a current between the first location and the second location based on the voltage drop between the first location and the second location and the resistance of the busbar, and calculating the magnitude of the output current provided to the second one of the plurality of power outlets based on a difference between the current between the first location and the second location and the magnitude of the output current provided to the first one of the plurality of power outlets.

According to another embodiment, measuring a voltage drop between the first location and each area of the busbar to which one of the plurality of power outlets is coupled includes measuring a first voltage at the first location, measuring a voltage at each one of the areas of the busbar to which one of the plurality of power outlets is coupled, and measuring the voltage drop between the first location and each area of the busbar to which one of the plurality of power outlets is coupled based on a difference between the first voltage and the voltage at each one of the areas of the busbar to which one of the plurality of power outlets is coupled. In one embodiment, measuring the first voltage at the first location includes receiving, with each one of a plurality of amplifiers coupled to the first location, a first voltage signal from the first location via a first sense line. In another embodiment, each one of the plurality of amplifiers is also coupled, via a sense line, to one of the areas of the busbar to which one of the plurality of power outlets is coupled, and measuring the voltage at each one of the areas of the busbar to which one of the plurality of power outlets is coupled includes receiving, with each one of the plurality of amplifiers via a sense line, a voltage signal from one of the areas of the busbar to which one of the plurality of power outlets is coupled.

According to one embodiment, measuring the voltage drop between the first location and each area of the busbar to which one of the plurality of power outlets is coupled includes generating, with each one of the plurality of amplifiers, a voltage drop signal based on the difference between the first voltage signal from the first location and the voltage signal from one of the areas of the busbar to which one of the plurality of power outlets is coupled. In another embodiment, the method further comprises amplifying, with the plurality of amplifiers, the voltage drop signals. In one embodiment, the method further comprises providing the voltage drop signals to a controller.

According to another embodiment, providing the voltage drop signals to the controller includes providing the voltage drop signals to a multiplexer, transmitting, from the controller to the multiplexer, signals to select one of the voltage drop signals received from the plurality of amplifiers, and providing, with the multiplexer, the selected voltage drop signal to the controller. In another embodiment, the method further comprises periodically updating the output current calculations for each one of the plurality of power outlets.

One aspect of the invention is directed to a Power Distribution Unit (PDU) comprising an input configured to be coupled to a power source and to receive input power, a busbar coupled to the input at a first location on the busbar, a plurality of power outlets, each coupled to a location on the busbar via an output line and configured to provide output power to a load, and means for measuring voltage drops between the first location and the other locations on the busbar to which one of the plurality of power outlets is coupled, and for calculating a magnitude of output current provided to each one of the plurality of power outlets based on the measured voltage drops and a resistance of the busbar.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
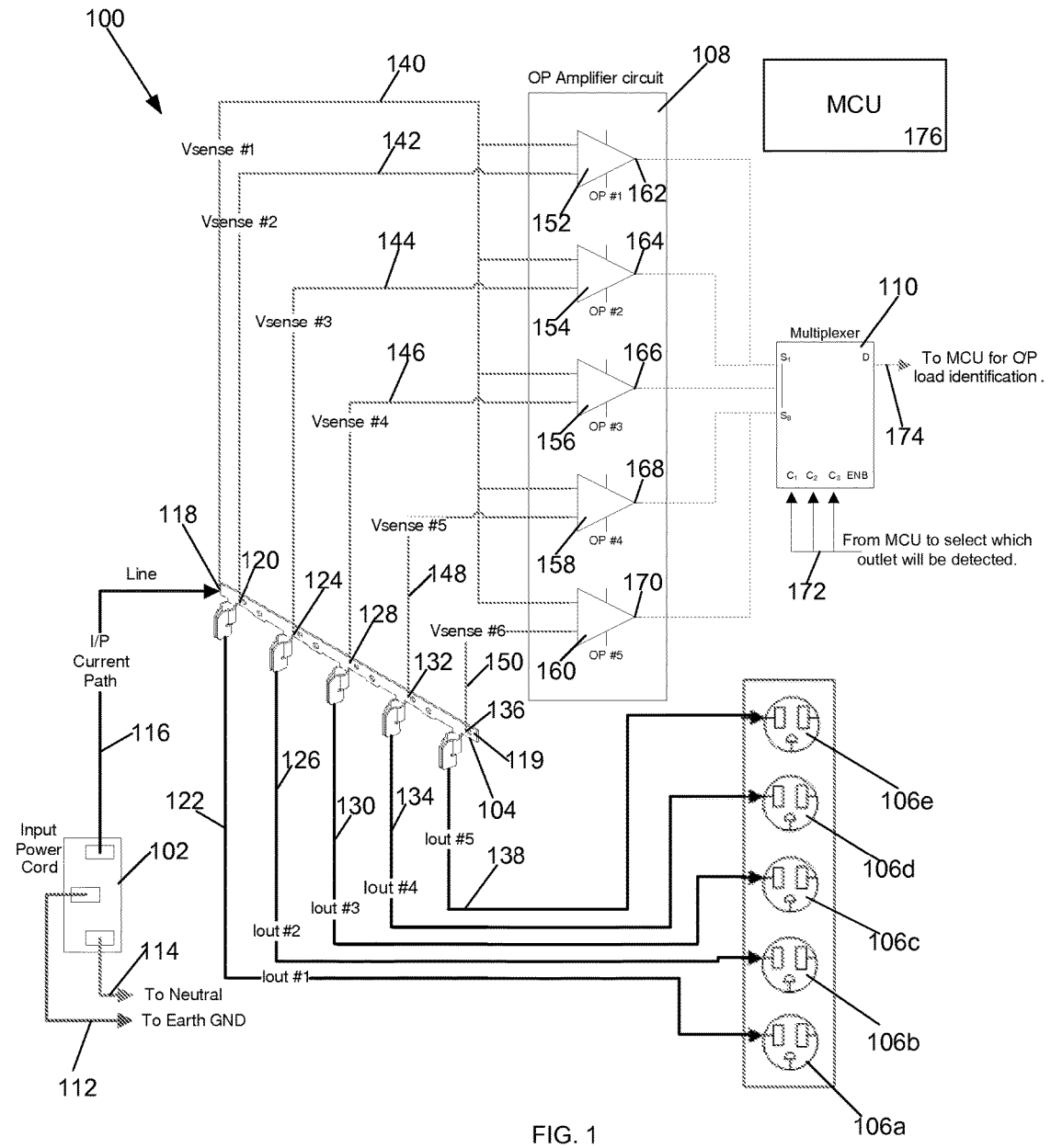
FIG. 1 illustrates a power distribution unit according to aspects of the current invention.

Various embodiments and aspects thereof will now be discussed in detail with reference to the accompanying drawings. It is to be appreciated that this invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, an electrical appliance or load may be coupled to a power outlet of a power distribution unit (e.g., a power strip) to receive power from the power distribution unit. As power is provided by the power outlet to the load, it may be desired to measure the output current of the power outlet.

Common power distribution units include a mutual inductor or Current Transformer (CT) coupled to each power outlet of the power distribution unit. The mutual inductors or CTs are typically configured to generate a reduced current signal, proportionate to the current from the power outlet to a load. For example, a mutual inductor or CT coupled to a power outlet of a power distribution unit may produce a reduced current AC signal, proportionate to the magnitude of AC current from the power outlet to a load. The reduced current AC signal may then either be measured directly or converted to a DC signal and then measured. Based on the signal received, the level of current from the power outlet to the load may be determined.

Such power distribution units typically require the use of potentially large and relatively expensive mutual inductors or CTs. At least some embodiments described herein provide a system and method for measuring the magnitude of output current of power outlets within a power distribution unit by measuring voltage drops across a busbar within the power distribution unit, negating the need for mutual inductors and CTs.

FIG. 1 illustrates a power distribution unit 100 according to at least some embodiments described herein. The power distribution unit 100 includes an input power cord 102, a busbar 104, a plurality of power outlets 106a-e, an amplifier circuit 108, and a multiplexer 110.

The input power cord 102 is coupled to a first end 118 of the busbar 104 via an input line 116. A first power outlet 106a is coupled to a first area 120 of the busbar 104 via a first output line 122. A second power outlet 106b is coupled to a second area 124 of the busbar 104 via a second output line 126. A third power outlet 106c is coupled to a third area 128 of the busbar 104 via a third output line 130. A fourth power outlet 106d is coupled to a fourth area 132 of the busbar 104 via a fourth output line 134. A fifth power outlet 106e is coupled to a fifth area 136 of the busbar 104, adjacent a second end 119 of the busbar 104, via a fifth output line 138.

The first area 120 of the busbar 104 is also coupled to a terminal of a first operational amplifier 152 of the amplifier circuit 108 via a second sense line 142. The second area 124 of the busbar 104 is also coupled to a terminal of a second operational amplifier 154 of the amplifier circuit 108 via a third sense line 144. The third area 128 of the busbar 104 is also coupled to a terminal of a third operational amplifier 156 of the amplifier circuit 108 via a fourth sense line 146. The fourth area 132 of the busbar 104 is also coupled to a terminal of a fourth operational amplifier 158 of the amplifier circuit 108 via a fifth sense line 148. The fifth area 136 of the busbar 104 is also coupled to a terminal of a fifth operational amplifier 160 of the amplifier circuit 108 via a sixth sense line 150. The first end 118 of the busbar 104 is also coupled to a terminal of each one of the operational amplifiers 152-160 within the amplifier circuit 108 via a first sense line 140. The output 162-170 of each operational amplifier 152-160 is coupled to the multiplexer 110. The multiplexer 110 is also coupled to a processor 176 via an output line 174 and control lines 172. According to one embodiment the controller 176 is a Microcontroller Unit (MCU).

The input cord 102 is configured to be coupled to an external AC power source (e.g., such as a utility AC power source) and to receive AC power from the power source. The input cord 102 is also configured to be coupled to a neutral line 114 and to ground 112. The received AC power is provided to the first end 118 of the busbar 104 via the input line 116. The AC power is provided, via output lines 122, 126, 130, 134, 138, to any one of the power outlets 106a-e that are coupled to a load which is configured to receive power.

As current passes from the first end 118 of the busbar 104 to different active power outlets 106a-e via the output lines 122, 126, 130, 134, 138, voltage is generated on the busbar 104 due to resistance in the busbar 104. By measuring voltage drops between the first end 118 of the busbar 104 and the other areas 120, 124, 128, 132, 136 of the busbar 104, the magnitude of the output current provided to each active power outlet 106a-e may be determined.

For example, the first operational amplifier 152 of the amplifier circuit 108 receives a voltage signal from the first end 118 of the busbar 104 via the first sense line 140 and a voltage signal from the first area 120 of the busbar 104 via the second sense line 142. Based on the received voltage signals, the operational amplifier 152 calculates the voltage drop between the first end 118 and the first area 120 of the busbar 120 and provides an amplified signal representing the voltage drop to the multiplexer 110 via the output 162.

The second operational amplifier 154 of the amplifier circuit 108 receives a voltage signal from the first end 118 of the busbar 104 via the first sense line 140 and a voltage signal from the second area 124 of the busbar 104 via the third sense line 144. Based on the received voltage signals, the operational amplifier 154 calculates the voltage drop between the first end 118 and the second area 124 of the busbar 120 and provides an amplified signal representing the voltage drop to the multiplexer 110 via the output 164.

The third operational amplifier 156 of the amplifier circuit 108 receives a voltage signal from the first end 118 of the busbar 104 via the first sense line 140 and a voltage signal from the third area 128 of the busbar 104 via the fourth sense line 146. Based on the received voltage signals, the operational amplifier 156 calculates the voltage drop between the first end 118 and the third area 128 of the busbar 120 and provides an amplified signal representing the voltage drop to the multiplexer 110 via the output 166.

The fourth operational amplifier 158 of the amplifier circuit 108 receives a voltage signal from the first end 118 of the busbar 104 via the first sense line 140 and a voltage signal from the fourth area 132 of the busbar 104 via the fifth sense line 148. Based on the received voltage signals, the operational amplifier 158 calculates the voltage drop between the first end 118 and the fourth area 132 of the busbar 120 and provides an amplified signal representing the voltage drop to the multiplexer 110 via the output 168.

The fifth operational amplifier 160 of the amplifier circuit 108 receives a voltage signal from the first end 118 of the busbar 104 via the first sense line 140 and a voltage signal from the fifth area 136 of the busbar 104 via the sixth sense line 150. Based on the received voltage signals, the operational amplifier 160 calculates the voltage drop between the first end 118 and the fifth area 136 of the busbar 120 and provides an amplified signal representing the voltage drop to the multiplexer 110 via the output 170.

The controller 176 transmits control signals, via the control line 172, to the multiplexer to select one of the amplified voltage drop signals (from the amplifier circuit 108) to be provided to the controller 176 via the output line 174. By receiving each one of the amplified voltage drop signals, the controller 176 is able to calculate the magnitude of the output current provided to each one of the active power outlets 106a-e. According to one embodiment, the multiplexer 110 includes an Analog to Digital (A/D) converter and is configured to provide a digital representation of a selected one of the amplified voltage drop signals to the controller 176 via the output line 174.

According to one embodiment, based on the received signals representative of the voltage drops between the first end 118 and the different areas 120, 124, 128, 132, 136, of the busbar 104 and a known resistance of the busbar 102, the controller 176 calculates the magnitude of the output current provided to each active power outlet 106a-e.

For example, based on the voltage drop between the first end 118 and the fifth area 136 and a known resistance of the busbar 104, the controller 176 can calculate the magnitude of the current on the busbar 104 between the fourth area 132 and the fifth area 136 (i.e., the magnitude of the output current on the fifth output line 138 provided to an active fifth power outlet 106e). Based on the voltage drop between the first end 118 and the fourth area 132, a known resistance of the busbar 104, and the calculated magnitude of the output current on the fifth output line 138, the controller 176 calculates the magnitude of the output current on the fourth output line 134 provided to an active fourth power outlet 106d. Based on the voltage drop between the first end 118 and the third area 128, a known resistance of the busbar 104, and the calculated magnitude of the output currents on the fourth 134 and fifth 138 output lines, the controller 176 calculates magnitude of the output current on the third output line 130 provided to an active third power outlet 106c. Based on the voltage drop between the first end 118 and the second area 124, a known resistance of the busbar 104, and the calculated magnitude of the output currents on the third 130, fourth 134 and fifth 138 output lines, the controller 176 calculates the magnitude of the output current on the second output line 126 provided to an active second power outlet 106b. Based on the voltage drop between the first end 118 and the first area 120, a known resistance of the busbar 104, and the calculated magnitude of the output currents on the second 126, third 130, fourth 134 and fifth 138 output lines, the controller 176 calculates the magnitude of the output current on the first output line 122 provided to an active first power outlet 106a.

According to one embodiment, the controller 176 transmits the calculated current values to an external monitoring system and/or may display output current on a display device of the power distribution unit. Calculation of output current provided to power outlets 106a-e within the power distribution unit 100 is described in greater detail below with regard to FIG. 2.

Figure 2:
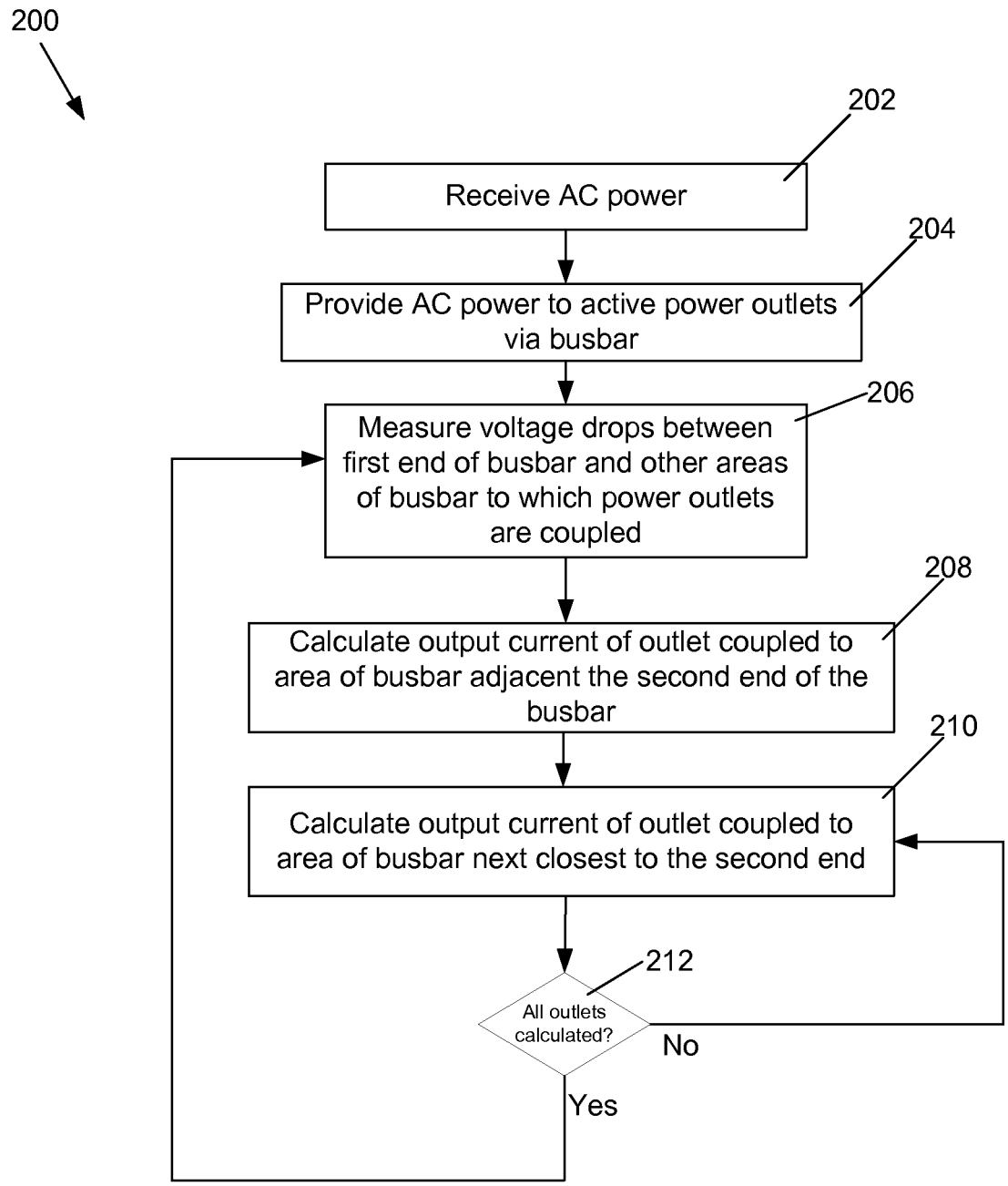
FIG. 2 illustrates a process for measuring output current to outlets of a power distribution unit.

FIG. 2 illustrates a process 200 for measuring the magnitude of output current to active power outlets 106a-e of a power distribution unit 100. At block 202, AC power from an external AC power source is received by the power distribution unit 100 (e.g., via the input cord 102). At block 204, the AC power is provided to active power outlets 106a-e (i.e., power outlets to which a load is coupled and configured to receive power from the power outlet) via the busbar 104 and the output lines 122, 126, 130, 124, 138.

At block 206, voltage drops between the first end 118 and areas 120, 124, 128, 132, 136 of the busbar 104 to which power outlets 106a-e are coupled are measured and amplified with the amplifier circuit 108 as discussed above. At block 208, the magnitude of the output current of the power outlet coupled to an area of the busbar 104 adjacent the second end 119 of the busbar 104 is calculated (i.e., the current provided to the fifth power outlet 106e coupled to the fifth area 136 of the busbar 104 in FIG. 1). As described above, the magnitude of the output current of the fifth power outlet 106e may be calculated based on the voltage drop between the first end 118 of the busbar and the fifth area 136 and a known resistance of the busbar 104. The current provided to the fifth power outlet 106e via the fifth output line 138 is relatively the same as the current between the fourth area 132 and the fifth area 136 as there is no additional current path beyond the fifth output line 138 coupled to the fifth area 136 (i.e., the fifth output line 138 is coupled to the fifth area 136 at the second end 119 of the busbar 119).

At block 210, the magnitude of the output current of the power outlet coupled to the area of the busbar 104 next closest to the second end 119 is calculated (i.e., the fourth power outlet 106d coupled to the fourth area 132 of the busbar 104 in FIG. 1). As described above, the magnitude of the output current of the fourth power outlet 106d may be calculated based on the voltage drop between the first end 118 of the busbar and the fourth area 132, the calculated current provided to the fifth power outlet 106e, and a known resistance of the busbar 104. For example, based on the voltage drop between the first end 118 and the fourth area 132, the current between the third area 128 and the fourth area 132 may be calculated. By subtracting the calculated current provided to the fifth power outlet 106e (i.e., the current between the fourth area 132 and the fifth area 136) from the calculated current between the third area 128 and the fourth area 132, the current provided to the fourth outlet 106d via the fourth output line 134 may be determined.

At block 212, a determination is made whether the output current of each power outlet has been calculated. At block 210, in response to a determination that output current has not yet been calculated for each power outlet, the magnitude of the output current of the power outlet coupled to the area of the busbar 104 next closest to the second end 119 (i.e., the third power outlet 106c coupled to the third area 128 of the busbar 104 in FIG. 1) is calculated. As described above, the magnitude of the output current of the third power outlet 106c may be calculated based on the voltage drop between the first end 118 of the busbar and the third area 128, the total current provided to the fourth 106d and fifth 106e power outlets (i.e., the calculated current between the third area 128 and the fourth area 132), and a known resistance of the busbar 104. For example, based on the voltage drop between the first end 118 and the third area 128, the current between the second area 124 and the third area 128 may be calculated. By subtracting the calculated current between the third area 128 and the fourth area 132 from the calculated current between the second area 124 and the third area 128, the current provided to the third outlet 106c via the third output line 130 may be determined.

The magnitude of the output current provided to each one of the other power outlets of the power distribution unit 100 may similarly be calculated until the output current of each power outlet is calculated. At blocks 206-210, in response to a determination that output current has been calculated for each power outlet, the voltage drop measurements and current calculations are performed again to dynamically update the magnitude of the output currents of each one of the power outlets.

As described above, the power distribution unit 100 includes five power outlets; however, in other embodiments, the power distribution unit 100 may include any number of power outlets. Additionally, according to some embodiments, the power distribution unit 100 may be coupled to additional power control systems, and in addition may be incorporated in different types of power devices, such as an Uninterruptible Power Supply (UPS).

As described herein, the input line 116 from the input power cord 102 is coupled to a first end 118 of the busbar 104; however, in other embodiments, the input line 116 may be coupled to any other portion of the busbar 104 and voltage drops across the busbar 104 could still be used to calculate the magnitudes of output current provided to each power outlet coupled to the busbar 104.

As described herein, the output current of each power outlet is progressively calculated (i.e., from the power outlet coupled to an area adjacent the second end of the busbar to the power outlet coupled to an area adjacent the first end); however, in other embodiments, the output current calculations may be performed in a different order.

As described herein, voltage drops across a busbar are measured to calculate the output current of power outlets coupled to the busbar; however, in other embodiments, voltage drops across any other type of conductive element may be measured and used to calculate the output current of power outlets coupled to the conductive element.

As described herein, voltage drops between the first end of the busbar and different areas of the busbar are measured; however, in at least one embodiment, a CT is coupled to the input line 116 and is configured to provide a signal to the controller 176 that is proportionate to the total input current of the busbar 104. The signal from the CT, representing the total input current of the busbar 104, is used by the controller in the output current calculation for each power outlet.

As described herein, the power distribution unit 100 includes a controller that calculates the magnitude of the output currents of the power outlets of the power distribution unit 100; however, in other embodiments, the output current calculations may be performed in a controller located external to the power distribution unit (e.g., such as in a controller of a UPS coupled to the power distribution unit 100).

As described herein, the power distribution unit 100 receives AC power from an external AC source; however, in other embodiments, the power distribution unit 100 is configured to be coupled to a DC power source and to receive DC power.

As described herein, the power distribution unit 100 includes a single busbar 104, a single amplifier circuit 108, a single multiplexer 110, and a single controller 176; however, in other embodiments, the power distribution unit 100 may include any number of busbars 104, any number of appropriate amplifier circuits, any number of appropriate multiplexers, and any number of appropriate controllers 176.

As described herein, a process and system for monitoring output current provided to power outlets of a power distribution unit is described; however, in other embodiments, the process and system for monitoring output current may be utilized in any type of device that includes a busbar or other conductive element.

Accordingly, at least some embodiments described herein provide a system and method for measuring output current of power outlets within a power distribution unit by measuring voltage drops across a busbar within the power distribution unit. By measuring output current based on voltage drops across a busbar, the use of relatively expensive and large components such as mutual inductors and CT's may be avoided.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A Power Distribution Unit (PDU) comprising:
an input configured to be coupled to a power source and to receive input power;
a busbar coupled to the input at a first location on the busbar, the bus bar having a resistance;
at least one power outlet coupled to a second location on the busbar via a first output line and configured to provide output power to a load; and
a sensing circuit coupled proximate to the first location on the busbar and coupled proximate to the second location on the busbar and configured to determine a voltage drop between the first location and the second location and to calculate a magnitude of an output current provided to the at least one power outlet via the output line based on the voltage drop and the resistance of the busbar,
wherein the sensing circuit includes a first amplifier coupled proximate to the first location via a first sense line and proximate to the second location via a second sense line, and a second amplifier coupled proximate to the first location via the first sense line and proximate to the third location via a third sense line, the first amplifier configured to receive a first voltage signal and a second voltage signal and to measure the voltage drop between the first location and the second location based on a difference between the first voltage signal and the second voltage signal, and
wherein the at least one power outlet includes a first power outlet coupled to the second location on the busbar via the first output line and a second power outlet coupled to a third location on the busbar via a second output line.

2. The PDU of claim 1, wherein the first amplifier is configured to receive the first voltage signal and the second voltage signal, to measure the voltage drop between the first location and the second location based on the difference between the first voltage signal and the second voltage signal, and to generate a first amplified signal related to the voltage drop between the first location and the second location; and
wherein the second amplifier is configured to receive the first voltage signal and a third voltage signal, to measure the voltage drop between the first location and the third location based on a difference between the first voltage signal and the third voltage signal, and to generate a second amplified signal related to the voltage drop between the first location and the third location.

3. The PDU of claim 2, wherein the sensing circuit further includes a controller coupled to the first amplifier and the second amplifier, and wherein the controller is configured to receive the first amplified signal and the second amplified signal, to calculate a magnitude of a first output current provided to the first power outlet via the first output line based on the first amplified signal and the resistance of the busbar, and to calculate a magnitude of a second output current provided to the second power outlet via the second output line based on the second amplified signal, the first amplified signal, and the resistance of the busbar.

4. The PDU of claim 2, further comprising a multiplexer coupled to the controller, the first amplifier, and the second amplifier, and configured to receive the first amplified signal and the second amplified signal,
wherein the controller is further configured to operate the multiplexer to select one of the first amplified signal and the second amplified signal and to provide the selected one of the first amplified signal and the second amplified signal to the controller.

5. The PDU of claim 4, wherein the multiplexer includes an Analog to Digital (A/D) converter configured to provide a digital representation of the selected one of the first amplified signal and the second amplified signal to the controller.

6. A method for monitoring a power distribution unit having an input, a busbar having a resistance, and a plurality of power outlets, each power outlet coupled to a location on the busbar, the method comprising:
receiving, at the input, input power from a power source;
providing the input power to each one of the plurality of power outlets via the busbar;
measuring a voltage drop between a first location on the busbar and each location on the busbar to which one of the plurality of power outlets is coupled; and
calculating a magnitude of an output current provided to each one of the plurality of power outlets based on the measured voltage drop between the first location and the location to which each one of the plurality of power outlets is coupled and the resistance of the busbar, wherein measuring the voltage drop between the first location on the busbar and each location on the busbar to which one of the plurality of power outlets is coupled includes measuring the voltage drop between the first location on the busbar and a second location on the busbar to which a first one of the plurality of power outlets is coupled and measuring a voltage drop between the first location on the busbar and a third location on the busbar to which a second one of the plurality of power outlets is coupled, and wherein calculating a magnitude of the output current provided to each one of the plurality of power outlets includes calculating a magnitude of an output current provided to the first one of the plurality of power outlets based on the voltage drop between the first location and the second location and the resistance of the busbar and calculating a magnitude of an output current provided to the second one of the plurality of power outlets based on the voltage drop between the first location and the third location, the magnitude of the output current provided to the first one of the plurality of power outlets, and the resistance of the busbar.

7. The method of claim 6, wherein calculating a magnitude of an output current provided to the second one of the plurality of power outlets includes:

calculating a current between the first location and the second location based on the voltage drop between the first location and the second location and the resistance of the busbar; and calculating the magnitude of the output current provided to the second one of the plurality of power outlets based on a difference between the current between the first location and the second location and the magnitude of the output current provided to the first one of the plurality of power outlets.

8. The method of claim 6, further comprising periodically updating the output current calculations for each one of the plurality of power outlets.

9. The method of claim 6, wherein measuring a voltage drop between the first location and each area of the busbar to which one of the plurality of power outlets is coupled includes:

measuring a first voltage at the first location;

measuring a voltage at each one of the areas of the busbar to which one of the plurality of power outlets is coupled; and measuring the voltage drop between the first location and each area of the busbar to which one of the plurality of power outlets is coupled based on a difference between the first voltage and the voltage at each one of the areas of the busbar to which one of the plurality of power outlets is coupled.

10. The method of claim 9, wherein measuring the first voltage at the first location includes receiving, with each one of a plurality of amplifiers coupled to the first location, a first voltage signal from the first location via a first sense line.

11. The method of claim 10, wherein each one of the plurality of amplifiers is also coupled, via a sense line, to one of the areas of the busbar to which one of the plurality of power outlets is coupled, and wherein measuring the voltage at each one of the areas of the busbar to which one of the plurality of power outlets is coupled includes receiving, with each one of the plurality of amplifiers via a sense line, a voltage signal from one of the areas of the busbar to which one of the plurality of power outlets is coupled.

12. The method of claim 11, wherein measuring the voltage drop between the first location and each area of the busbar to which one of the plurality of power outlets is coupled includes generating, with each one of the plurality of amplifiers, a voltage drop signal based on the difference between the first voltage signal from the first location and the voltage signal from one of the areas of the busbar to which one of the plurality of power outlets is coupled.

13. The method of claim 12, further comprising amplifying, with the plurality of amplifiers, the voltage drop signals.

14. The method of claim 12, further comprising providing the voltage drop signals to a controller.

15. The method of claim 14, wherein providing the voltage drop signals to the controller includes:

providing the voltage drop signals to a multiplexer;

transmitting, from the controller to the multiplexer, signals to select one of the voltage drop signals received from the plurality of amplifiers; and providing, with the multiplexer, the selected voltage drop signal to the controller.

16. A Power Distribution Unit (PDU) comprising:

an input configured to be coupled to a power source and to receive input power;

a busbar coupled to the input at a first location on the busbar;

a plurality of power outlets, each coupled to a location on the busbar via an output line and configured to provide output power to a load; and means for measuring a first voltage drop between the first location on the busbar and a second location on the busbar to which a first one of the plurality of power outlets is coupled, for measuring a second voltage drop between the first location on the busbar and a third location on the busbar to which a second one of the plurality of power outlets is coupled, for calculating a magnitude of output current provided to the first one of the plurality of power outlets based on the first voltage drop and a resistance of the busbar, and for calculating a magnitude of an output current provided to the second one of the plurality of power outlets based on the second voltage drop, the magnitude of the output current provided to the first one of the plurality of power outlets, and the resistance of the busbar.

* * * * *